(12) United States Patent
Wang et al.

(10) Patent No.: US 11,500,001 B2
(45) Date of Patent: Nov. 15, 2022

(54) INSULATION RESISTANCE DETECTION CIRCUIT AND METHOD

(71) Applicant: Huawei Digital Power Technologies Co., Ltd., Shenzhen (CN)

(72) Inventors: Chen Wang, Shanghai (CN); Xiaowei Xie, Shanghai (CN); Yang Hu, Shanghai (CN)

(73) Assignee: Huawei Digital Power Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/486,506

(22) Filed: Sep. 27, 2021

(65) Prior Publication Data
US 2022/0011356 A1    Jan. 13, 2022

Related U.S. Application Data

(63) Continuation of application No. PCT/CN2020/097544, filed on Jun. 22, 2020.

(30) Foreign Application Priority Data

Jul. 26, 2019  (CN) .......................... 201910683371.7

(51) Int. Cl.
*G01R 27/02*      (2006.01)
*G01R 27/08*      (2006.01)
(Continued)

(52) U.S. Cl.
CPC ........... *G01R 27/025* (2013.01); *G01R 27/08* (2013.01); *G01R 27/18* (2013.01); *G01R 31/42* (2013.01);
(Continued)

(58) Field of Classification Search
CPC ...... G01R 27/00; G01R 27/02; G01R 27/025; G01R 27/08; G01R 27/16; G01R 20/18;
(Continued)

(56) References Cited

U.S. PATENT DOCUMENTS 5,514,967 A * 5/1996 Zelm .................. G01R 31/1227
324/765.01
7,138,778 B2   11/2006 Fujino et al.
(Continued)

FOREIGN PATENT DOCUMENTS

CN          101697418 A     4/2010
CN          101699696 A     4/2010
(Continued)

OTHER PUBLICATIONS

Shen Wenzhong, "Solar Photovoltaic Technologies and Applications," Shanghai Jiaotong University, total 4 pages (2013). With English abstract.

*Primary Examiner* — Hoai-An D. Nguyen
(74) *Attorney, Agent, or Firm* — Leydig, Voit & Mayer, Ltd.

(57) ABSTRACT

An insulation resistance detection circuit and method are disclosed. The circuit includes a controller configured to: open a first relay, and close second relays, or switch an on/off status of at least one of the second relays; determine, based on a first measurement value between a positive input terminal of an inverter circuit and an earthing point, whether the positive input terminal of the inverter circuit is short-circuited or has low resistance to protective earthing; and determine, based on a second measurement value between a negative input terminal of the inverter circuit and the earthing point, whether the negative input terminal of the inverter circuit is short-circuited or has low resistance to protective earthing, where the first relay is one of in M relays and is connected to at least one impedor in parallel, and the second relays are relays other than the first relay in the M relays.

13 Claims, 6 Drawing Sheets

(51) Int. Cl.
*G01R 27/18* (2006.01)
*G01R 31/42* (2006.01)
*G01R 31/52* (2020.01)
*H02J 3/38* (2006.01)
*H02M 7/44* (2006.01)
*H02S 40/32* (2014.01)

(52) U.S. Cl.
CPC .............. *G01R 31/52* (2020.01); *H02J 3/381* (2013.01); *H02M 7/44* (2013.01); *H02S 40/32* (2014.12); *H02J 2300/24* (2020.01)

(58) Field of Classification Search
CPC ........ G01R 31/00; G01R 31/40; G01R 31/42; G01R 31/50; G01R 31/52; H02J 3/00; H02J 3/38; H02J 3/381; H02J 2300/00; H02J 2300/20; H02J 2300/22; H02J 2300/24; H02M 7/00; H02M 7/42; H02M 7/44; H02S 40/00; H02S 40/30; H02S 40/32; Y02E 10/00; Y02E 10/50; Y02E 10/56
See application file for complete search history.

(56) References Cited

U.S. PATENT DOCUMENTS

| | | | |
|---|---|---|---|
| 9,869,710 B2 | 1/2018 | Oberzaucher et al. | |
| 10,384,545 B2 * | 8/2019 | Schmelzer | B60L 3/04 |
| 10,503,126 B2 * | 12/2019 | Ni | H02S 50/00 |
| 2012/0049630 A1 | 3/2012 | Hofheinz | |
| 2016/0245855 A1 * | 8/2016 | Serban | H02M 3/156 |
| 2017/0106754 A1 * | 4/2017 | Schmelzer | G01R 31/006 |
| 2018/0153008 A1 * | 5/2018 | Luccato | H02M 3/156 |
| 2018/0252754 A1 * | 9/2018 | Mochizuki | H02H 3/16 |
| 2018/0302030 A1 | 10/2018 | Friebe et al. | |

FOREIGN PATENT DOCUMENTS

| | | |
|---|---|---|
| CN | 102751894 A | 10/2012 |
| CN | 202486217 U | 10/2012 |
| CN | 103048544 A | 4/2013 |
| CN | 203720267 U | 7/2014 |
| CN | 104730412 A | 6/2015 |
| CN | 204481761 U | 7/2015 |
| CN | 204758699 U | 11/2015 |
| CN | 105548755 A | 5/2016 |
| CN | 105938171 A | 9/2016 |
| CN | 108475928 A | 8/2018 |
| CN | 108896822 A | 11/2018 |
| CN | 109696582 A | 4/2019 |
| CN | 109725202 A | 5/2019 |
| CN | 110456154 A | 11/2019 |
| EP | 2646841 B1 | 5/2016 |
| KR | 101666734 B1 | 10/2016 |

* cited by examiner

INSULATION RESISTANCE DETECTION CIRCUIT AND METHOD

CROSS-REFERENCE TO RELATED APPLICATIONS

This application is a continuation of International Application No. PCT/CN2020/097544, filed on Jun. 22, 2020, which claims priority to Chinese Patent Application No. 201910683371.7, filed on Jul. 26, 2019. The disclosures of the aforementioned applications are hereby incorporated by reference in their entireties.

TECHNICAL FIELD

This application relates to the field of grid-connected inverters, and in particular, to an insulation resistance detection circuit and method.

BACKGROUND

In a scenario in which a direct current power generating device (for example, a solar battery) is connected to an alternating current power grid, an inverter needs to be used to perform a grid-connected operation.

In the conventional technology, for a non-isolated alternating current power grid whose power grid side is not connected to a transformer, when a housing of an inverter has no protective earthing conductor (protective earthing or PE) or is poorly earthed, if a direct current input terminal of the inverter is short-circuited to protective earthing (zero resistance to protective earthing) or has low resistance to protective earthing, in this case, if the inverter is directly connected to the grid, the direct current input terminal of the inverter forms a short-circuit loop with the alternating current power grid, causing inverter failure.

SUMMARY

Embodiments of this application provide an insulation resistance detection circuit and method, to detect whether a direct current input terminal of an inverter is short-circuited to protective earthing or has low resistance to protective earthing.

To achieve the foregoing objective, the embodiments of this application use the following technical solutions:

According to a first aspect, an insulation resistance detection circuit is provided, including: a controller, an inverter circuit, a first direct current voltage source, a second direct current voltage source, a filter circuit, and a switch circuit. The inverter circuit includes a positive input terminal, a negative input terminal, and N alternating current output terminals. The filter circuit includes N input terminals and N output terminals. The switch circuit includes N input terminals, N output terminals, M relays, and at least one impedor. Each relay includes N relay switches, an input terminal of an $i^{th}$ relay switch of a first relay is used as an $i^{th}$ input terminal of the switch circuit, and an output terminal of an $i^{th}$ relay switch of an $M^{th}$ relay is used as an $i^{th}$ output terminal of the switch circuit. When the quantity M is greater than 1, $i^{th}$ relay switches of the relays are sequentially connected in series. N is an integer greater than 1, M is an integer greater than or equal to 1, i is an integer greater than or equal to 1 and less than or equal to N, and j is an integer greater than or equal to 1 and less than or equal to M. A positive electrode of the first direct current voltage source is connected to the positive input terminal of the inverter circuit, a negative electrode of the first direct current voltage source is connected to a positive electrode of the second direct current voltage source, and a negative electrode of the second direct current voltage source is connected to the negative input terminal of the inverter circuit. An $i^{th}$ alternating current output terminal of the inverter circuit is connected to an $i^{th}$ input terminal of the filter circuit, an $i^{th}$ output terminal of the filter circuit is connected to the $i^{th}$ input terminal of the switch circuit, and the $i^{th}$ output terminal of the switch circuit is connected to an $i^{th}$ terminal of an alternating current power grid. At least one relay switch in the switch circuit is connected to the at least one impedor in parallel. The controller is configured to: open a first relay, and close second relays, or switch an on/off status of at least one of the second relays; determine, based on a first measurement value between the positive input terminal of the inverter circuit and an earthing point, whether the positive input terminal of the inverter circuit is short-circuited to protective earthing or has low resistance to protective earthing; and determine, based on a second measurement value between the negative input terminal of the inverter circuit and the earthing point, whether the negative input terminal of the inverter circuit is short-circuited to protective earthing or has low resistance to protective earthing. The first relay is a relay in the M relays that is connected to the at least one impedor in parallel, and the second relays are relays other than the first relay in the M relays. According to the insulation resistance detection circuit provided in the embodiments of this application, the relay switch of the relay is connected to the impedor in parallel, and a change of a measurement value between the direct current input terminal of the inverter and the earthing point is detected by switching the on/off status of the relay. If the direct current input terminal of the inverter is short-circuited to the earthing point or has low resistance to the earthing point, the measurement value varies little or does not change, thereby detecting whether the direct current input terminal of the inverter is short-circuited to protective earthing or has low resistance to protective earthing.

In the embodiments of this application, being short-circuited to protective earthing means that resistance to protective earthing is zero.

In a possible implementation, N=2, and the filter circuit includes a first inductor, a second inductor, and a first capacitor. A first terminal of the first inductor is used as a first input terminal of the filter circuit, and a first terminal of the second inductor is used as a second input terminal of the filter circuit. A second terminal of the first inductor is connected to a first terminal of the first capacitor, and the second terminal of the first inductor and the first terminal of the first capacitor are used as a first output terminal of the filter circuit. A second terminal of the second inductor is connected to a second terminal of the first capacitor, and the second terminal of the second inductor and the second terminal of the first capacitor are used as a second output terminal of the filter circuit. This implementation provides a possible implementation of the filter circuit when the alternating current power grid uses a single-phase alternating current.

In a possible implementation, N=3, and the filter circuit includes a first inductor, a second inductor, a third inductor, a first capacitor, a second capacitor, and a third capacitor. A first terminal of the first inductor is used as a first input terminal of the filter circuit, a first terminal of the second inductor is used as a second input terminal of the filter circuit, and a first terminal of the third inductor is used as a third input terminal of the filter circuit. A second terminal of the first inductor is connected to a first terminal of the first capacitor, and the second terminal of the first inductor and the first terminal of the first capacitor are used as a first output terminal of the filter circuit. A second terminal of the second inductor is connected to a first terminal of the second capacitor, and the second terminal of the second inductor and the first terminal of the second capacitor are used as a second output terminal of the filter circuit. A second terminal of the third inductor is connected to a first terminal of the third capacitor, and the second terminal of the second inductor and the first terminal of the third capacitor are used as a third output terminal of the filter circuit. A second terminal of the first capacitor, a second terminal of the second capacitor, and a second terminal of the third capacitor are connected. This implementation provides a possible implementation of the filter circuit when the alternating current power grid uses a three-phase alternating current.

In a possible implementation, the second terminal of the first capacitor, the second terminal of the second capacitor, and the second terminal of the third capacitor are further connected to the positive input terminal of the inverter circuit.

In a possible implementation, the second terminal of the first capacitor, the second terminal of the second capacitor, and the second terminal of the third capacitor are further connected to the negative electrode of the first direct current voltage source.

In a possible implementation, the first direct current voltage source and the second direct current voltage source are capacitors.

According to a second aspect, an insulation resistance detection method is provided, and is applied to the insulation resistance detection circuit according to any one of the first aspect and the implementations of the first aspect. The method includes: opening a first relay, and closing second relays, or switching an on/off status of at least one of the second relays; determining, based on a first measurement value between a positive input terminal of an inverter circuit and an earthing point, whether the positive input terminal of the inverter circuit is short-circuited to protective earthing or has low resistance to protective earthing; and determining, based on a second measurement value between a negative input terminal of the inverter circuit and the earthing point, whether the negative input terminal of the inverter circuit is short-circuited to protective earthing or has low resistance to protective earthing. The first relay is a relay in M relays that is connected to at least one impedor in parallel, and the second relays are relays other than the first relay in the M relays. For a technical effect of the second aspect, refer to the description of the first aspect.

DESCRIPTION OF EMBODIMENTS

Embodiments of this application provide an insulation resistance detection circuit and method, to detect whether a direct current input terminal of an inverter is short-circuited to protective earthing or has low resistance to protective earthing. Before a grid-connected operation of the inverter and when a housing is not earthed, the insulation resistance detection circuit can prevent the direct current input terminal of the inverter from being short-circuited to protective earthing or having low resistance to protective earthing, thereby preventing a grid-connected insulation failure. The insulation resistance detection circuit can be applied to a solar panel grid-connected system, and can also be applied to other DC-to-AC and AC-to-DC systems.

In the embodiments of this application, a relay switch of a relay in an inverter circuit is connected to an impedor in parallel, and a change of a measurement value between the direct current input terminal of the inverter and an earthing point is detected by switching an on/off status of the relay switch of the relay. If the direct current input terminal of the inverter is short-circuited to the earthing point or has low resistance to the earthing point, the measurement value varies little or does not change, thereby determining whether the direct current input terminal of the inverter is short-circuited to protective earthing or has low resistance to protective earthing.

Figure 1:
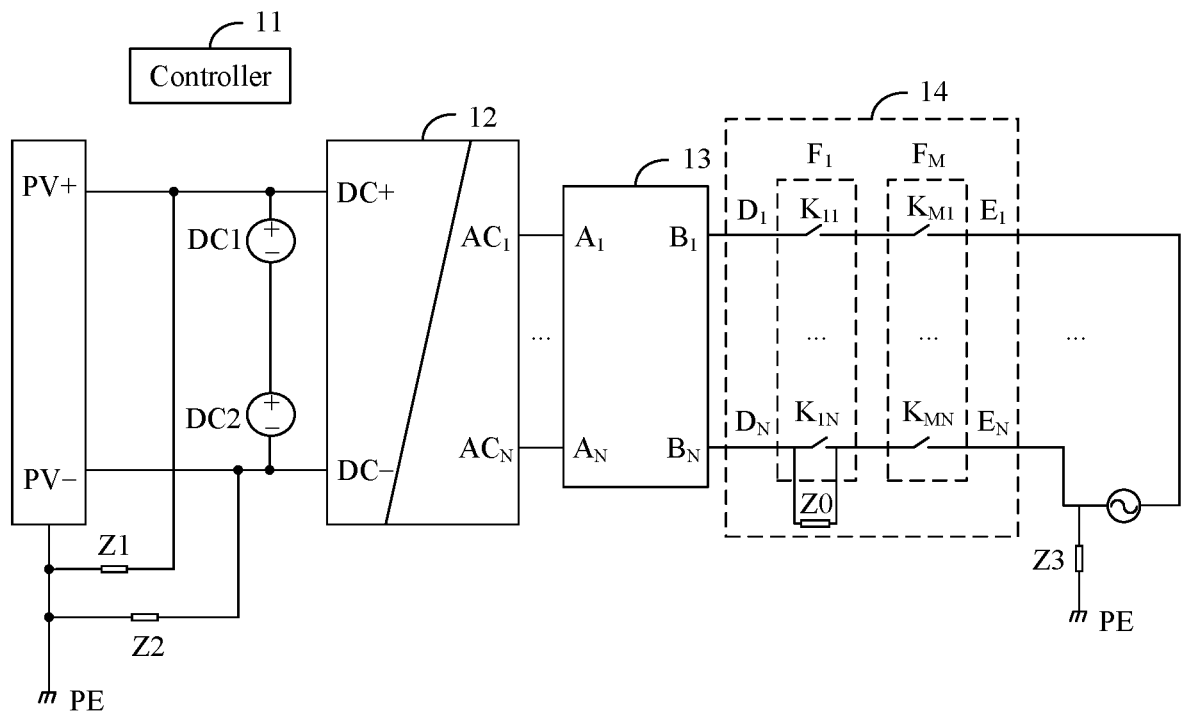
FIG. 1 is a schematic diagram 1 of a structure of an insulation resistance detection circuit according to an embodiment of this application.

As shown in FIG. 1, the insulation resistance detection circuit includes a controller 11, an inverter circuit 12, a filter circuit 13, a switch circuit 14, a first direct current voltage source DC1, and a second direct current voltage source DC2.

The inverter circuit 12 includes a positive input terminal DC+, a negative input terminal DC−, and N alternating current output terminals $AC_1$ to $AC_N$. The positive input terminal DC+ may be configured to connect to a positive electrode PV+ of a direct current voltage source (for example, a solar panel), and the negative input terminal DC− may be configured to connect to a negative electrode PV− of the direct current voltage source (for example, the solar panel).

N is an integer greater than 1. For example, N may be 2 or 3. When N is 2, the inverter circuit can convert a direct current output by the direct current voltage source into a single-phase alternating current. In this case, one of a first alternating current output terminal $AC_1$ and a second alternating current output terminal $AC_2$ outputs the single-phase alternating current, and the other is earthed. When N is 3, the inverter circuit can convert the direct current into a three-phase alternating current, and three alternating current output terminals $AC_1$ to $AC_3$ separately output a single-phase alternating current.

The filter circuit 13 includes N input terminals $A_1$ to $A_N$ and N output terminals $B_1$ to $B_N$. The filter circuit 13 is configured to filter the alternating current output by the inverter circuit 12.

The switch circuit 14 includes N input terminals $D_1$ to $D_N$, N output terminals $E_1$ to $E_N$, M relays $F_1$ to $F_M$, and at least one impedor Z0. Each relay includes N relay switches, and on/off statuses of relay switches of a single relay are the same, that is, simultaneously opened or simultaneously closed. For example, the relay $F_1$ includes relay switches $K_{11}$ to $K_{1N}$, and the relay $F_M$ includes relay switches $K_{M1}$ to $K_{MN}$. When the relay $F_1$ is closed, the relay switches $K_{11}$ to $K_{1N}$ are also closed. When the relay $F_1$ is opened, the relay switches $K_{11}$ to $K_{1N}$ are also opened. M is an integer greater than or equal to 1.

An input terminal of an $i^{th}$ relay switch of a first relay is used as an $i^{th}$ input terminal of the switch circuit 14. For example, an input terminal of the first relay switch $K_{11}$ of the first relay $F_1$ is used as the first input terminal $D_1$ of the switch circuit 14. An input terminal of the $N^{th}$ relay switch $K_{1N}$ of the first relay $F_1$ is used as the $N^{th}$ input terminal $D_N$ of the switch circuit 14.

An output terminal of an $i^{th}$ relay switch of an $M^{th}$ relay is used as an $i^{th}$ output terminal of the switch circuit 14. For example, an output terminal of the first relay switch $K_{M1}$ of the $M^{th}$ relay $F_M$ is used as the first output terminal $E_1$ of the switch circuit 14. An output terminal of the $N^{th}$ relay switch $K_{MN}$ of the $M^{th}$ relay $F_M$ is used as the $i^{th}$ output terminal $E_N$ of the switch circuit 14.

When the quantity M is greater than 1, $i^{th}$ relay switches of the relays are sequentially connected in series. That is, relay switches of a same sequence number of the relays are sequentially connected in series. i is an integer greater than or equal to 1 and less than or equal to N, and j is an integer greater than or equal to 1 and less than or equal to M.

The switch circuit 14 is configured to control a grid-connected operation and an off-grid operation of an entire system. When M is greater than 1, the relay switches of the same sequence number of the relays are sequentially connected in series, to prevent an off-grid operation failure of the entire system due to a failure to open a single relay, thereby improving security of the entire system. It should be noted that this application is not limited to the use of relays, and other components having an on-off function may alternatively be used, or a module in which components having an on-off function are connected in series and in parallel may be used.

A positive electrode of the first direct current voltage source DC1 is connected to the positive input terminal DC+ of the inverter circuit 12, a negative electrode of the first direct current voltage source DC1 is connected to a positive electrode of the second direct current voltage source DC2, and a negative electrode of the second direct current voltage source DC2 is connected to the negative input terminal DC− of the inverter circuit 12. The first direct current voltage source DC1 and the second direct current voltage source DC2 may be capacitors, which are configured to store energy for direct currents output by the direct current voltage sources (PV+ and PV−).

An $i^{th}$ alternating current output terminal of the inverter circuit 12 is connected to an $i^{th}$ input terminal of the filter circuit 13, and an $i^{th}$ output terminal of the filter circuit 13 is connected to the $i^{th}$ input terminal of the switch circuit 14. The $i^{th}$ output terminal of the switch circuit 14 is connected to an $i^{th}$ terminal of an alternating current power grid.

At least one relay switch in the switch circuit 14 is connected to the at least one impedor Z0 in parallel. The at least one impedor Z0 may be a resistor with a fixed resistance value, or may be a variable resistor after the relays are closed. The at least one impedor Z0 may alternatively be a current limiting device such as a capacitor, a negative temperature coefficient (NTC) thermistor, a positive temperature coefficient (PTC) thermistor, or an inductor; or may be a module formed by connecting devices in series and in parallel.

In FIG. 1, equivalent resistance between the positive input terminal DC+ of the inverter circuit 12 and an earthing point is Z1. Equivalent resistance between the negative input terminal DC− of the inverter circuit 12 and the earthing point is Z2. Equivalent resistance between the alternating current power grid and the earthing point is Z3.

Figure 2:
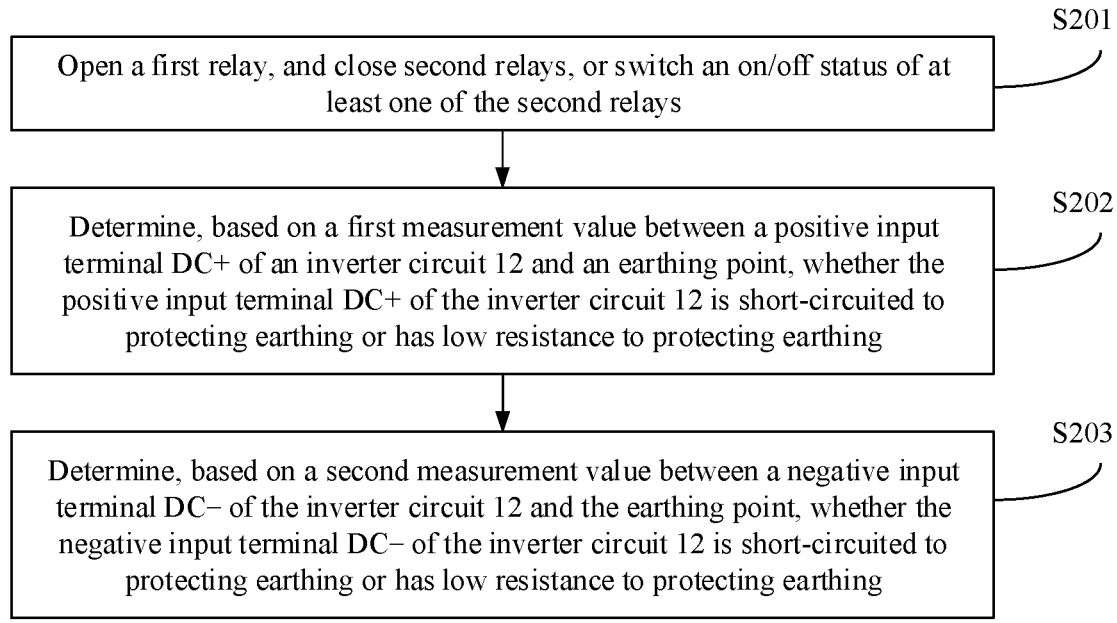
FIG. 2 is a schematic flowchart of an insulation resistance detection method according to an embodiment of this application.

The controller 11 is configured to perform an insulation resistance detection method shown in FIG. 2.

S201: Open a first relay, and close second relays, or switch an on/off status of at least one of the second relays.

The first relay is a relay in M relays that is connected to an impedor in parallel, and the second relays are relays other than the first relay in the M relays.

For example, as shown in FIG. 1, the first relay is a relay $F_1$, and the second relays are relays $F_2$ to $F_M$.

It should be noted that, that the controller 11 switches the on/off status of the at least one of the second relays may mean that the controller 11 may first control all relays of the second relays to be closed, and then control at least one of the second relays to be opened; or the controller 11 may first control at least one of the second relays to be opened, and then control all relays of the second relays to be closed. This is not limited in this application.

S202: Determine, based on a first measurement value between a positive input terminal DC+ of an inverter circuit 12 and an earthing point, whether the positive input terminal DC+ of the inverter circuit 12 is short-circuited to protective earthing or has low resistance to protective earthing.

Specifically, when the second relays are closed, whether the positive input terminal of the inverter circuit is short-circuited to protective earthing or has low resistance to protective earthing is determined based on whether an absolute value of the first measurement value between the positive input terminal of the inverter circuit and the earthing point is less than a first preset threshold. Alternatively, when the on/off status of the at least one of the second relays is switched, whether the positive input terminal of the inverter circuit is short-circuited to protective earthing or has low resistance to protective earthing is determined based on whether an absolute value of a difference between first measurement values between the positive input terminal of the inverter circuit and the earthing point before and after the switching is less than a second preset threshold.

For example, if the first measurement value is less than the first preset threshold when the second relays are closed, or if the absolute value of the difference between the first measurement values before and after the switching is less than the second preset threshold when the on/off status of the at least one of the second relays is switched, it can be determined that the resistance Z1 to protective earthing is short-circuited to protective earthing or low resistance.

S203: Determine, based on a second measurement value between a negative input terminal DC− of the inverter circuit 12 and the earthing point, whether the negative input terminal DC− of the inverter circuit 12 is short-circuited to protective earthing or has low resistance to protective earthing.

Specifically, when the second relays are closed, whether the negative input terminal of the inverter circuit is short-circuited to protective earthing or has low resistance to protective earthing is determined based on whether an absolute value of the second measurement value between the negative input terminal of the inverter circuit and the earthing point is less than a third preset threshold. Alternatively, when the on/off status of the at least one of the second relays is switched, whether the positive input terminal of the inverter circuit is short-circuited to protective earthing or has low resistance to protective earthing is determined based on whether an absolute value of a difference between second measurement values between the negative input terminal of the inverter circuit and the earthing point before and after the switching is less than a fourth preset threshold.

For example, if the second measurement value is less than the third preset threshold when the second relays are closed, or if the absolute value of the difference between the second measurement values before and after the switching is less than the fourth preset threshold when the on/off status of the at least one of the second relays is switched, it can be determined that the resistance Z2 to protective earthing is short-circuited to protective earthing or low resistance.

Optionally, the first measurement value and the second measurement value may be impedance voltages, direct current components of currents, alternating current components of currents, absolute values of high frequency components of currents, changes of currents, absolute values of resistance, changes of resistance, or the like.

The following uses an example to describe the foregoing steps.

Figure 3:
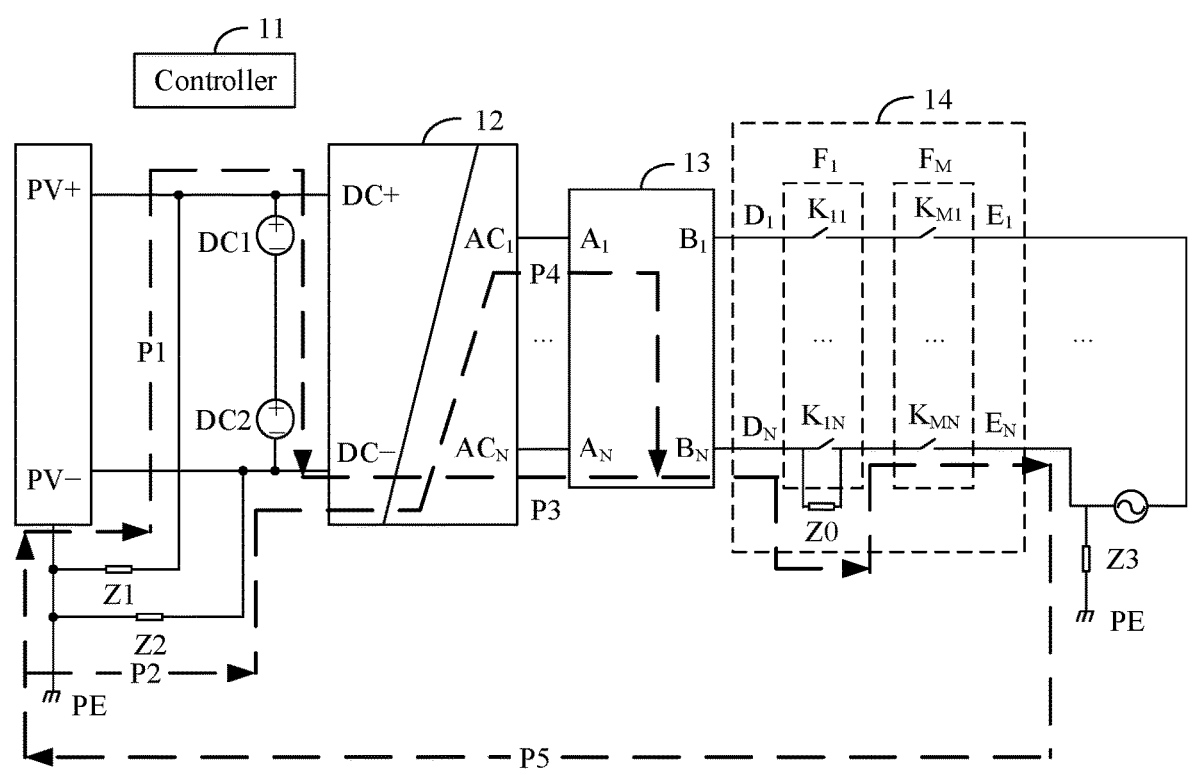
FIG. 3 is a schematic diagram 1 of a current loop of an insulation resistance detection circuit according to an embodiment of this application.

For example, as shown in FIG. 3, it is assumed that an impedor Z0 is connected to a relay switch $K_{1N}$ of the relay $F_1$ in parallel, and the controller 11 first opens the relay $F_1$ (that is, opens relay switches $K_{11}$ to $K_{1N}$) and closes relays (relays $F_1$ to $F_M$) other than the relay $F_1$. A current on Z1 forms a loop by using paths P1, P3, Z0, and P5, and a current on Z2 forms a loop by using paths P2, P4, Z0, and P5. In this case, the first measurement value and the second measurement value may be measured for the first time. Then, the controller 11 opens any one of the relays (relays $F_1$ to $F_M$) other than the relay $F_1$. In this case, the first measurement value and the second measurement value may be measured for the second time.

Whether resistance R1 to protective earthing is short-circuited to protective earthing or low resistance may be determined based on whether the first measurement value measured for the first time is less than the first preset threshold. Alternatively, whether resistance R1 to protective earthing is short-circuited to protective earthing or low resistance may be determined based on whether an absolute value of a difference between the first measurement values measured twice is less than the second preset threshold.

Whether resistance R1 to protective earthing is short-circuited to protective earthing or low resistance may be determined based on whether the second measurement value measured for the first time is less than the third preset threshold. Alternatively, whether resistance R2 to protective earthing is short-circuited to protective earthing or low resistance may be determined based on whether an absolute value of a difference between the second measurement values measured twice is less than the fourth preset threshold.

The foregoing circuit is specifically described below by using a single-phase alternating current and a three-phase alternating current.

Figure 4:
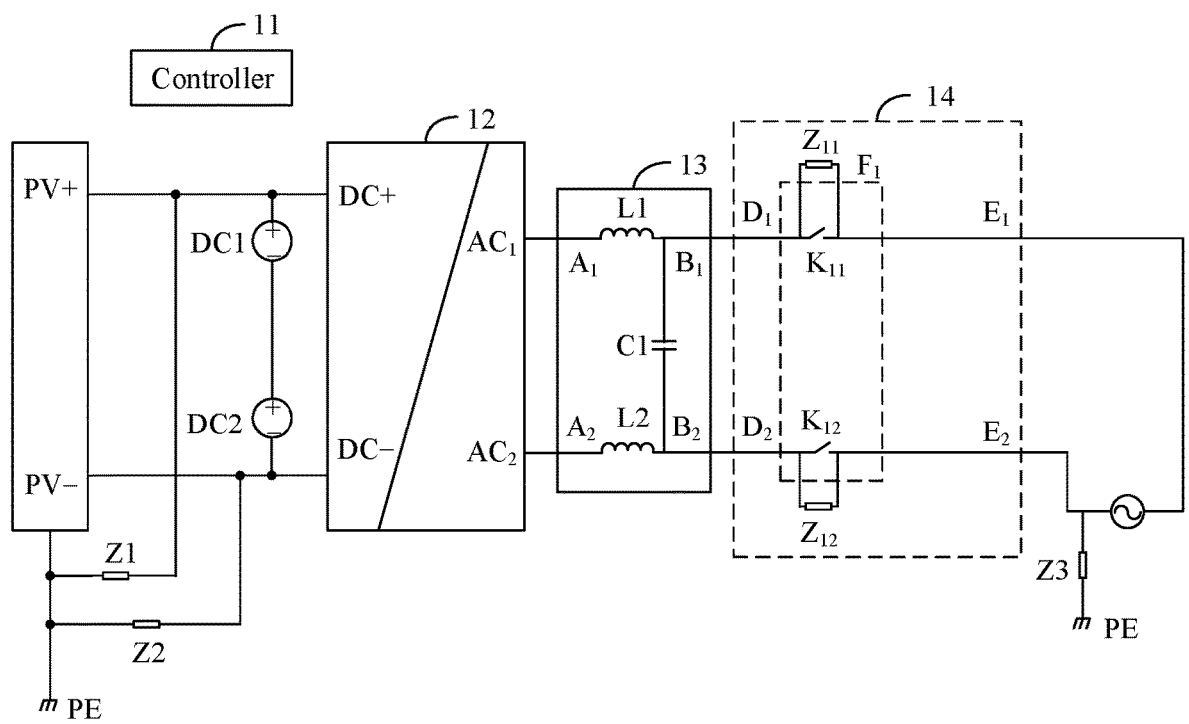
FIG. 4 is a schematic diagram 2 of a structure of an insulation resistance detection circuit according to an embodiment of this application.

Optionally, as shown in FIG. 4, when N=2, that is, when the inverter circuit outputs a single-phase alternating current, the filter circuit 13 includes a first inductor L1, a second inductor L2, and a first capacitor C1.

A first terminal of the first inductor L1 is used as a first input terminal of the filter circuit 13, and a first terminal of the second inductor L2 is used as a second input terminal of the filter circuit 13. A second terminal of the first inductor L1 is connected to a first terminal of the first capacitor C1, and the second terminal of the first inductor L1 and the first terminal of the first capacitor C1 are used as a first output terminal of the filter circuit 13. A second terminal of the second inductor L2 is connected to a second terminal of the first capacitor C1, and the second terminal of the second inductor L2 and the second terminal of the first capacitor C1 are used as a second output terminal of the filter circuit 13.

In addition, FIG. 4 shows an example implementation in which the switch circuit 14 includes one relay $F_1$. The at least one impedor includes at least one of an impedor $Z_{11}$ and an impedor $Z_{12}$. In other words, various combinations of the impedor $Z_{11}$ and the impedor $Z_{12}$ are shown in Table 1.

TABLE 1

| Combination | $Z_{11}$ | $Z_{12}$ |
|---|---|---|
| 1 | 0 | 1 |
| 2 | 1 | 0 |
| 3 | 1 | 1 |

A leftmost column indicates a combination. In two columns on the right, 1 indicates that there is a corresponding impedor in the combination, and 0 indicates that there is no corresponding impedor in the combination.

Figure 5:
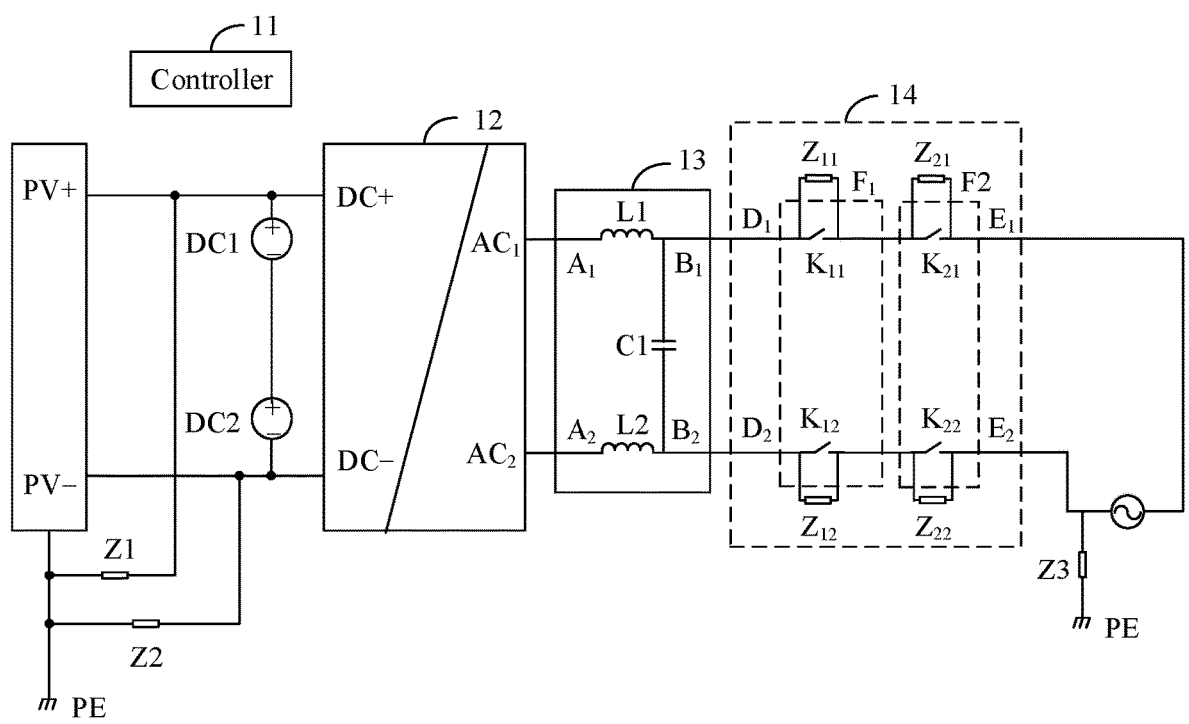
FIG. 5 is a schematic diagram 3 of a structure of an insulation resistance detection circuit according to an embodiment of this application.

In addition, FIG. 5 shows an example implementation in which the switch circuit 14 includes two relays $F_1$ and $F_2$. The at least one impedor includes at least one of an impedor $Z_{11}$, an impedor $Z_{12}$, an impedor $Z_{21}$, and an impedor $Z_{22}$. In other words, various combinations of the impedor $Z_{11}$, the impedor $Z_{12}$, the impedor $Z_{21}$, and the impedor $Z_{22}$ are shown in Table 2.

TABLE 2

| Combination | $Z_{11}$ | $Z_{12}$ | $Z_{21}$ | $Z_{22}$ |
|---|---|---|---|---|
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |
| 16 | 0 | 0 | 0 | 0 |
| 17 | 0 | 0 | 0 | 1 |
| 18 | 0 | 0 | 1 | 0 |
| 19 | 0 | 0 | 1 | 1 |
| 20 | 0 | 1 | 0 | 0 |
| 21 | 0 | 1 | 0 | 1 |
| 22 | 0 | 1 | 1 | 0 |
| 23 | 0 | 1 | 1 | 1 |

TABLE 2-continued

| Combination | $Z_{11}$ | $Z_{12}$ | $Z_{21}$ | $Z_{22}$ |
|---|---|---|---|---|
| 24 | 1 | 0 | 0 | 0 |
| 25 | 1 | 0 | 0 | 1 |
| 26 | 1 | 0 | 1 | 0 |
| 27 | 1 | 0 | 1 | 1 |
| 28 | 1 | 1 | 0 | 0 |
| 29 | 1 | 1 | 0 | 1 |
| 30 | 1 | 1 | 1 | 0 |
| 31 | 1 | 1 | 1 | 1 |

Figure 6:
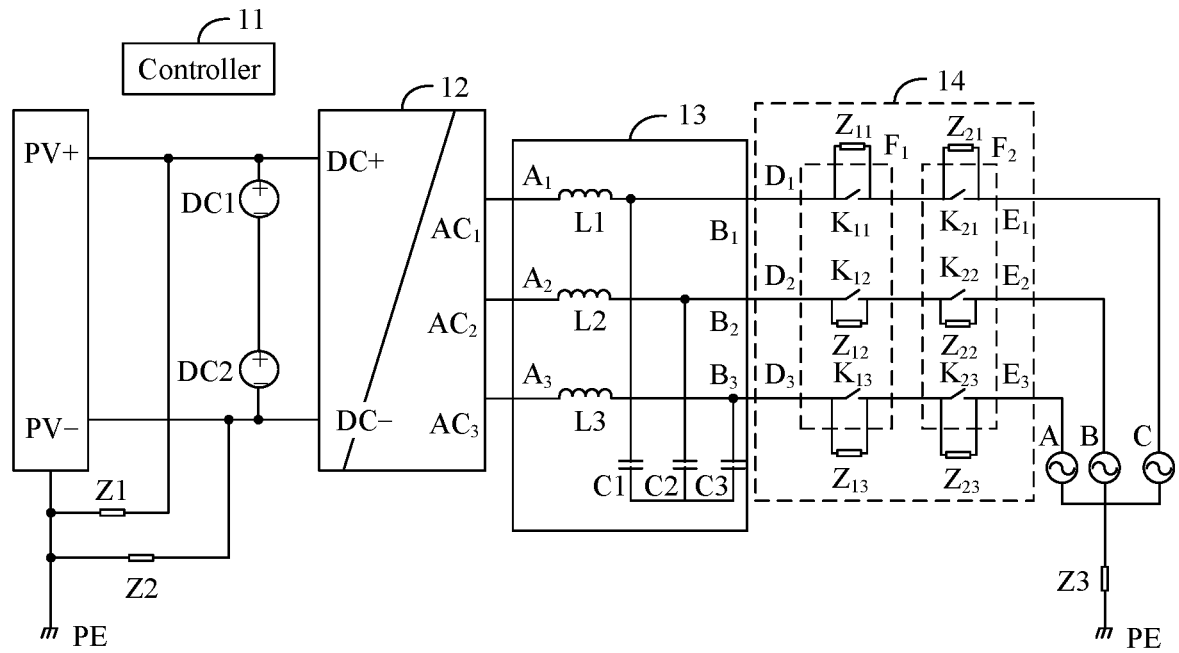
FIG. 6 is a schematic diagram 4 of a structure of an insulation resistance detection circuit according to an embodiment of this application.

Optionally, as shown in FIG. 6, N=3, and the filter circuit 13 includes a first inductor L1, a second inductor L2, a third inductor L3, a first capacitor C1, a second capacitor C2, and a third capacitor C3.

A first terminal of the first inductor L1 is used as a first input terminal of the filter circuit 13, a first terminal of the second inductor L2 is used as a second input terminal of the filter circuit 13, and a first terminal of the third inductor L3 is used as a third input terminal of the filter circuit 13.

A second terminal of the first inductor L1 is connected to a first terminal of the first capacitor C1, and the second terminal of the first inductor L1 and the first terminal of the first capacitor C1 are used as a first output terminal of the filter circuit 13. A second terminal of the second inductor L2 is connected to a first terminal of the second capacitor C2, and the second terminal of the second inductor L2 and the first terminal of the second capacitor C2 are used as a second output terminal of the filter circuit 13. A second terminal of the third inductor L3 is connected to a first terminal of the third capacitor C3, and the second terminal of the second inductor L2 and the first terminal of the third capacitor C3 are used as a third output terminal of the filter circuit 13.

A second terminal of the first capacitor C1, a second terminal of the second capacitor C2, and a second terminal of the third capacitor are connected.

In addition, FIG. 6 shows an example implementation in which the switch circuit 14 includes two relays $F_1$ and $F_2$. The at least one impedor includes at least one of an impedor $Z_{11}$, an impedor $Z_{12}$, an impedor $Z_{13}$, an impedor $Z_{21}$, an impedor $Z_{22}$, and an impedor $Z_{23}$. In other words, various combinations of the impedor $Z_{11}$, the impedor $Z_{12}$, the impedor $Z_{13}$, the impedor $Z_{21}$, the impedor $Z_{22}$, and the impedor $Z_{23}$ are shown in Table 3.

TABLE 3

| Combination | $Z_{11}$ | $Z_{12}$ | $Z_{13}$ | $Z_{21}$ | $Z_{22}$ | $Z_{23}$ |
|---|---|---|---|---|---|---|
| 1 | 0 | 0 | 0 | 0 | 0 | 1 |
| 2 | 0 | 0 | 0 | 0 | 1 | 0 |
| 3 | 0 | 0 | 0 | 0 | 1 | 1 |
| 4 | 0 | 0 | 0 | 1 | 0 | 0 |
| 5 | 0 | 0 | 0 | 1 | 0 | 1 |
| 6 | 0 | 0 | 0 | 1 | 1 | 0 |
| 7 | 0 | 0 | 0 | 1 | 1 | 1 |
| 8 | 0 | 0 | 1 | 0 | 0 | 0 |
| 9 | 0 | 0 | 1 | 0 | 0 | 1 |
| 10 | 0 | 0 | 1 | 0 | 1 | 0 |
| 11 | 0 | 0 | 1 | 0 | 1 | 1 |
| 12 | 0 | 0 | 1 | 1 | 0 | 0 |
| 13 | 0 | 0 | 1 | 1 | 0 | 1 |
| 14 | 0 | 0 | 1 | 1 | 1 | 0 |
| 15 | 0 | 0 | 1 | 1 | 1 | 1 |
| 16 | 0 | 1 | 0 | 0 | 0 | 0 |
| 17 | 0 | 1 | 0 | 0 | 0 | 1 |
| 18 | 0 | 1 | 0 | 0 | 1 | 0 |
| 19 | 0 | 1 | 0 | 0 | 1 | 1 |
| 20 | 0 | 1 | 0 | 1 | 0 | 0 |
| 21 | 0 | 1 | 0 | 1 | 0 | 1 |

TABLE 3-continued

| Combination | $Z_{11}$ | $Z_{12}$ | $Z_{13}$ | $Z_{21}$ | $Z_{22}$ | $Z_{23}$ |
|---|---|---|---|---|---|---|
| 22 | 0 | 1 | 0 | 1 | 1 | 0 |
| 23 | 0 | 1 | 0 | 1 | 1 | 1 |
| 24 | 0 | 1 | 1 | 0 | 0 | 0 |
| 25 | 0 | 1 | 1 | 0 | 0 | 1 |
| 26 | 0 | 1 | 1 | 0 | 1 | 0 |
| 27 | 0 | 1 | 1 | 0 | 1 | 1 |
| 28 | 0 | 1 | 1 | 1 | 0 | 0 |
| 29 | 0 | 1 | 1 | 1 | 0 | 1 |
| 30 | 0 | 1 | 1 | 1 | 1 | 0 |
| 31 | 0 | 1 | 1 | 1 | 1 | 1 |
| 32 | 1 | 0 | 0 | 0 | 0 | 0 |
| 33 | 1 | 0 | 0 | 0 | 0 | 1 |
| 34 | 1 | 0 | 0 | 0 | 1 | 0 |
| 35 | 1 | 0 | 0 | 0 | 1 | 1 |
| 36 | 1 | 0 | 0 | 1 | 0 | 0 |
| 37 | 1 | 0 | 0 | 1 | 0 | 1 |
| 38 | 1 | 0 | 0 | 1 | 1 | 0 |
| 39 | 1 | 0 | 0 | 1 | 1 | 1 |
| 40 | 1 | 0 | 1 | 0 | 0 | 0 |
| 41 | 1 | 0 | 1 | 0 | 0 | 1 |
| 42 | 1 | 0 | 1 | 0 | 1 | 0 |
| 43 | 1 | 0 | 1 | 0 | 1 | 1 |
| 44 | 1 | 0 | 1 | 1 | 0 | 0 |
| 45 | 1 | 0 | 1 | 1 | 0 | 1 |
| 46 | 1 | 0 | 1 | 1 | 1 | 0 |
| 47 | 1 | 0 | 1 | 1 | 1 | 1 |
| 48 | 1 | 1 | 0 | 0 | 0 | 0 |
| 49 | 1 | 1 | 0 | 0 | 0 | 1 |
| 50 | 1 | 1 | 0 | 0 | 1 | 0 |
| 51 | 1 | 1 | 0 | 0 | 1 | 1 |
| 52 | 1 | 1 | 0 | 1 | 0 | 0 |
| 53 | 1 | 1 | 0 | 1 | 0 | 1 |
| 54 | 1 | 1 | 0 | 1 | 1 | 0 |
| 55 | 1 | 1 | 0 | 1 | 1 | 1 |
| 56 | 1 | 1 | 1 | 0 | 0 | 0 |
| 57 | 1 | 1 | 1 | 0 | 0 | 1 |
| 58 | 1 | 1 | 1 | 0 | 1 | 0 |
| 59 | 1 | 1 | 1 | 0 | 1 | 1 |
| 60 | 1 | 1 | 1 | 1 | 0 | 0 |
| 61 | 1 | 1 | 1 | 1 | 0 | 1 |
| 62 | 1 | 1 | 1 | 1 | 1 | 0 |
| 63 | 1 | 1 | 1 | 1 | 1 | 1 |

Figure 7:
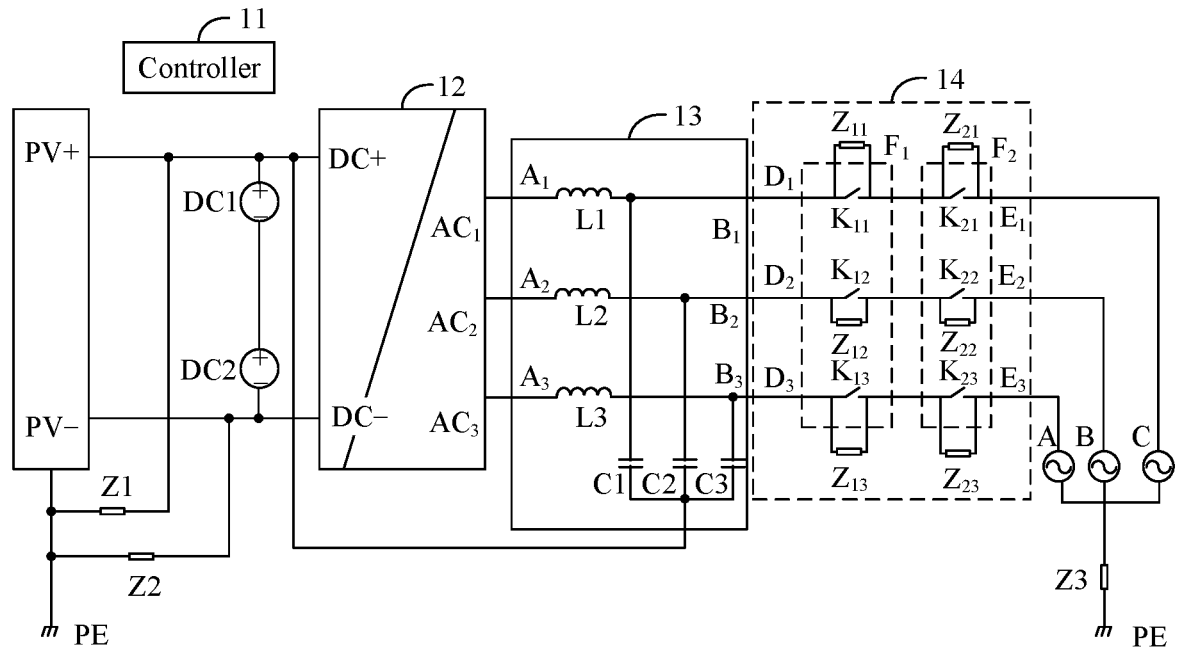
FIG. 7 is a schematic diagram 5 of a structure of an insulation resistance detection circuit according to an embodiment of this application.

Optionally, as shown in FIG. 7, the second terminal of the first capacitor C1, the second terminal of the second capacitor C2, and the second terminal of the third capacitor C3 may be further connected to the positive input terminal of the inverter circuit 12.

Figure 8:
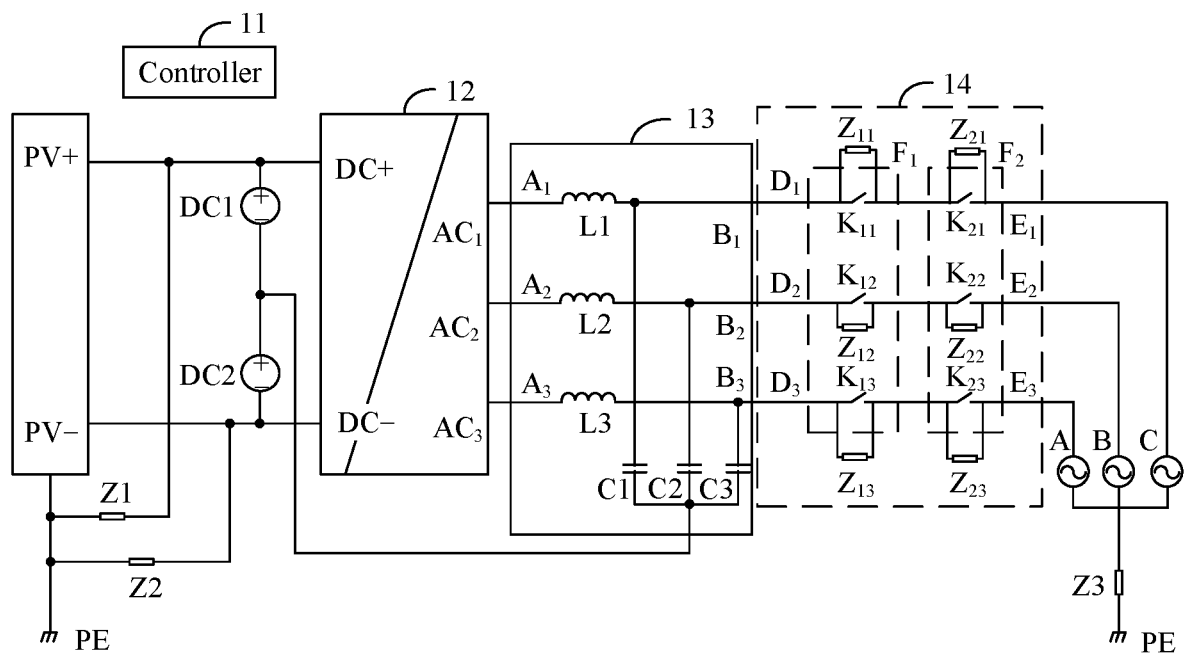
FIG. 8 is a schematic diagram 6 of a structure of an insulation resistance detection circuit according to an embodiment of this application.

Optionally, as shown in FIG. 8, the second terminal of the first capacitor C1, the second terminal of the second capacitor C2, and the second terminal of the third capacitor C3 may be further connected to the negative electrode of the first direct current voltage source DC1.

In addition, when there is a plurality of relays, and relay switches of the plurality of relays are connected to impedors in parallel, the controller 11 may randomly switch an on/off status of one relay, or cyclically switch on/off statuses of the relays, to avoid always switching the on/off status of one relay, which affects service life of the relay.

Figure 9:
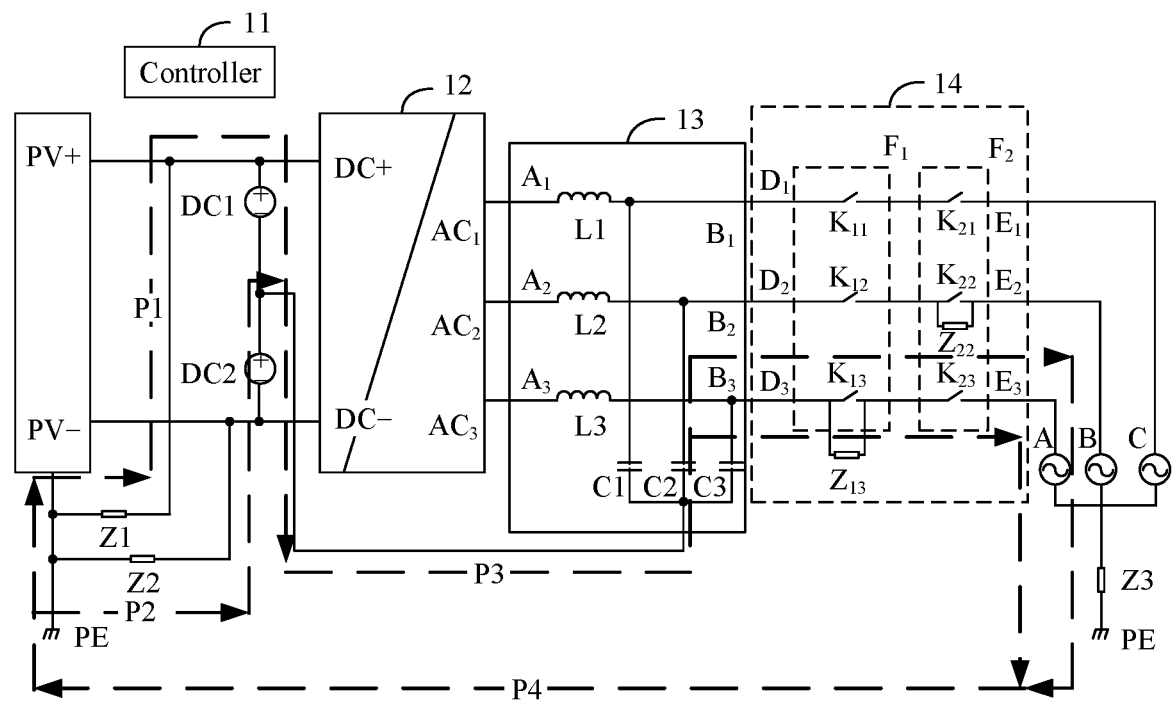
FIG. 9 is a schematic diagram 2 of a current loop of an insulation resistance detection circuit according to an embodiment of this application.

For example, FIG. 9 shows an implementation in which the switch circuit 14 includes two relays $F_1$ and $F_2$. The at least one impedor includes an impedor $Z_{13}$ and an impedor $Z_{22}$. The impedor $Z_{13}$ is connected to a relay switch $K_{13}$ of the relay $F_1$ in parallel. The impedor $Z_{22}$ is connected to a relay switch $K_{22}$ of the relay $F_2$ in parallel. The controller 11 may first open the relay $F_1$ and then close the relay $F_2$, so that a current on Z1 forms a loop by using paths P1, P3, $Z_{13}$, and P4, and a current on Z2 forms a loop by using paths P2, P3, $Z_{13}$, and P4. In this case, the first measurement value and the second measurement value may be measured for the first time. Then, the controller 11 opens the relay $F_2$. In this case, the first measurement value and the second measurement value may be measured for the second time.

Whether resistance R1 to protective earthing is short-circuited to protective earthing or low resistance may be determined based on whether the first measurement value measured for the first time is less than the first preset threshold. Alternatively, whether resistance R1 to protective earthing is short-circuited to protective earthing or low resistance may be determined based on whether an absolute value of a difference between the first measurement values measured twice is less than the second preset threshold.

Whether resistance R1 to protective earthing is short-circuited to protective earthing or low resistance may be determined based on whether the second measurement value measured for the first time is less than the third preset threshold. Alternatively, whether resistance R2 to protective earthing is short-circuited to protective earthing or low resistance may be determined based on whether an absolute value of a difference between the second measurement values measured twice is less than the fourth preset threshold.

Alternatively, the controller 11 may first open the relay $F_2$ and then open the relay $F_1$. In this case, the first measurement value and the second measurement value may be measured for the first time. Then, the controller 11 closes the relay $F_1$, so that a current on Z1 forms a loop by using paths P1, P3, $Z_{22}$, and P4, and a current on Z2 forms a loop by using paths P2, P3, $Z_{22}$, and P4. In this case, the first measurement value and the second measurement value may be measured for the second time.

Whether resistance R1 to protective earthing is short-circuited to protective earthing or low resistance may be determined based on whether the first measurement value measured for the second time is less than the first preset threshold. Alternatively, whether resistance R1 to protective earthing is short-circuited to protective earthing or low resistance may be determined based on whether an absolute value of a difference between the first measurement values measured twice is less than the second preset threshold.

Whether resistance R1 to protective earthing is short-circuited to protective earthing or low resistance may be determined based on whether the second measurement value measured for the second time is less than the third preset threshold. Alternatively, whether resistance R2 to protective earthing is short-circuited to protective earthing or low resistance may be determined based on whether an absolute value of a difference between the second measurement values measured twice is less than the fourth preset threshold.

According to the insulation resistance detection circuit and method provided in the embodiments of this application, the relay switch of the relay is connected to the impedor in parallel, and a change of a measurement value between the direct current input terminal of the inverter and the earthing point is detected by switching the on/off status of the relay. If the direct current input terminal of the inverter is short-circuited to the earthing point or has low resistance to the earthing point, the measurement value varies little or does not change, thereby detecting whether the direct current input terminal of the inverter is short-circuited to protective earthing or has low resistance to protective earthing.

It should be understood that sequence numbers of the foregoing processes do not mean execution sequences in various embodiments of this application. The execution sequences of the processes should be determined according to functions and internal logic of the processes, and should not be construed as any limitation on the implementation processes of the embodiments of this application.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

All or some of the foregoing embodiments may be implemented by using software, hardware, firmware, or any combination thereof. When a software program is used to implement the embodiments, all or some of the embodiments may be implemented in a form of a computer program product. The computer program product includes one or more computer instructions. When the computer program instructions are loaded and executed on the computer, the procedure or functions according to the embodiments of this application are all or partially generated. The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, for example, a server or a data center, integrating one or more usable media. The usable medium may be a magnetic medium (for example, a floppy disk, a hard disk, or a magnetic tape), an optical medium (for example, a digital versatile disc (DVD)), a semiconductor medium (for example, a solid-state drive (SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A circuit, comprising:
   a controller;
   an inverter circuit, comprising a positive input terminal, a negative input terminal, and N alternating current output terminals;
   a first direct current voltage source;
   a second direct current voltage source;
   a filter circuit, comprising N input terminals and N output terminals; and
   a switch circuit, comprising N input terminals, N output terminals, M relays, and at least one impedor, wherein each relay of the M relays comprises N relay switches, an input terminal of an $i^{th}$ relay switch of a first relay is used as an $i^{th}$ input terminal of the switch circuit, and an output terminal of an $i^{th}$ relay switch of an $M^{th}$ relay is used as an $i^{th}$ output terminal of the switch circuit, and wherein in response to the quantity M being greater than 1, $i^{th}$ relay switches of the relays are sequentially connected in series;

wherein N is an integer greater than 1, M is an integer greater than or equal to 1, and i is an integer greater than or equal to 1 and less than or equal to N;

wherein a positive electrode of the first direct current voltage source is connected to the positive input terminal of the inverter circuit, a negative electrode of the first direct current voltage source is connected to a positive electrode of the second direct current voltage source, and a negative electrode of the second direct current voltage source is connected to the negative input terminal of the inverter circuit;

wherein an $i^{th}$ alternating current output terminal of the inverter circuit is connected to an $i^{th}$ input terminal of the filter circuit, an $i^{th}$ output terminal of the filter circuit is connected to the $i^{th}$ input terminal of the switch circuit, and the $i^{th}$ output terminal of the switch circuit is connected to an $i^{th}$ terminal of an alternating current power grid;

wherein at least one relay switch in the switch circuit is connected to the at least one impedor in parallel; and wherein the controller is configured to:
  perform (i) opening a first relay and closing second relays, or (ii) switching an on/off status of at least one of the second relays; and
  determine, based on a first measurement value between the positive input terminal of the inverter circuit and an earthing point, whether the positive input terminal of the inverter circuit is short-circuited to protective earthing or has low resistance to protective earthing; and
  determine, based on a second measurement value between the negative input terminal of the inverter circuit and the earthing point, whether the negative input terminal of the inverter circuit is short-circuited to protective earthing or has low resistance to protective earthing, wherein the first relay is a relay in the M relays that is connected to the at least one impedor in parallel, and the second relays are relays other than the first relay in the M relays.

2. The circuit according to claim 1, wherein:

N=2, and the filter circuit comprises a first inductor, a second inductor, and a first capacitor;

a first terminal of the first inductor is used as a first input terminal of the filter circuit, and a first terminal of the second inductor is used as a second input terminal of the filter circuit;

a second terminal of the first inductor is connected to a first terminal of the first capacitor, and the second terminal of the first inductor and the first terminal of the first capacitor are used as a first output terminal of the filter circuit; and a second terminal of the second inductor is connected to a second terminal of the first capacitor, and the second terminal of the second inductor and the second terminal of the first capacitor are used as a second output terminal of the filter circuit.

3. The circuit according to claim 1, wherein:

N=3, and the filter circuit comprises a first inductor, a second inductor, a third inductor, a first capacitor, a second capacitor, and a third capacitor;

a first terminal of the first inductor is used as a first input terminal of the filter circuit, a first terminal of the second inductor is used as a second input terminal of the filter circuit, and a first terminal of the third inductor is used as a third input terminal of the filter circuit;

a second terminal of the first inductor is connected to a first terminal of the first capacitor, and the second terminal of the first inductor and the first terminal of the first capacitor are used as a first output terminal of the filter circuit;

a second terminal of the second inductor is connected to a first terminal of the second capacitor, and the second terminal of the second inductor and the first terminal of the second capacitor are used as a second output terminal of the filter circuit;

a second terminal of the third inductor is connected to a first terminal of the third capacitor, and the second terminal of the second inductor and the first terminal of the third capacitor are used as a third output terminal of the filter circuit; and a second terminal of the first capacitor, a second terminal of the second capacitor, and a second terminal of the third capacitor are connected.

4. The circuit according to claim 3, wherein the second terminal of the first capacitor, the second terminal of the second capacitor, and the second terminal of the third capacitor are further connected to the positive input terminal of the inverter circuit.

5. The circuit according to claim 3, wherein the second terminal of the first capacitor, the second terminal of the second capacitor, and the second terminal of the third capacitor are further connected to the negative electrode of the first direct current voltage source.

6. The circuit according to claim 1, wherein the first direct current voltage source and the second direct current voltage source are capacitors.

7. An insulation resistance detection method, comprising:

performing, by a controller, (i) opening a first relay and closing second relays, or (ii) switching an on/off status of at least one of the second relays;

determining, by the controller based on a first measurement value between a positive input terminal of an inverter circuit and an earthing point, whether the positive input terminal of the inverter circuit is short-circuited to protective earthing or has low resistance to protective earthing; and determining, by the controller based on a second measurement value between a negative input terminal of the inverter circuit and the earthing point, whether the negative input terminal of the inverter circuit is short-circuited to protective earthing or has low resistance to protective earthing, wherein the first relay is a relay in M relays that is connected to at least one impedor in parallel, and the second relays are relays other than the first relay in the M relays.

8. The method according to claim 7, wherein the controller is included in a circuit that includes the inverter circuit, a first direct current voltage source, a second direct current voltage source, a filter circuit, and a switch circuit, wherein the inverter circuit comprises a positive input terminal, a negative input terminal, and N alternating current output terminals;

wherein the filter circuit comprises N input terminals and N output terminals;

wherein the switch circuit comprises N input terminals, N output terminals, M relays, and at least one impedor, wherein each relay of the M relays comprises N relay switches, an input terminal of an $i^{th}$ relay switch of a first relay is used as an $i^{th}$ input terminal of the switch circuit, and an output terminal of an $i^{th}$ relay switch of an $M^{th}$ relay is used as an $i^{th}$ output terminal of the switch circuit, and wherein in response to the quantity M being greater than 1, $i^{th}$ relay switches of the relays are sequentially connected in series;

wherein N is an integer greater than 1, M is an integer greater than or equal to 1, and i is an integer greater than or equal to 1 and less than or equal to N;

wherein a positive electrode of the first direct current voltage source is connected to the positive input terminal of the inverter circuit, a negative electrode of the first direct current voltage source is connected to a positive electrode of the second direct current voltage source, and a negative electrode of the second direct current voltage source is connected to the negative input terminal of the inverter circuit;

wherein an $i^{th}$ alternating current output terminal of the inverter circuit is connected to an $i^{th}$ input terminal of the filter circuit, an $i^{th}$ output terminal of the filter circuit is connected to the $i^{th}$ input terminal of the switch circuit, and the $i^{th}$ output terminal of the switch circuit is connected to an $i^{th}$ terminal of an alternating current power grid; and wherein at least one relay switch in the switch circuit is connected to the at least one impedor in parallel.

9. The method according to claim 8, wherein:

N=2, and the filter circuit comprises a first inductor, a second inductor, and a first capacitor;

a first terminal of the first inductor is used as a first input terminal of the filter circuit, and a first terminal of the second inductor is used as a second input terminal of the filter circuit;

a second terminal of the first inductor is connected to a first terminal of the first capacitor, and the second terminal of the first inductor and the first terminal of the first capacitor are used as a first output terminal of the filter circuit; and a second terminal of the second inductor is connected to a second terminal of the first capacitor, and the second terminal of the second inductor and the second terminal of the first capacitor are used as a second output terminal of the filter circuit.

10. The method according to claim 8, wherein:

N=3, and the filter circuit comprises a first inductor, a second inductor, a third inductor, a first capacitor, a second capacitor, and a third capacitor;

a first terminal of the first inductor is used as a first input terminal of the filter circuit, a first terminal of the second inductor is used as a second input terminal of the filter circuit, and a first terminal of the third inductor is used as a third input terminal of the filter circuit;

a second terminal of the first inductor is connected to a first terminal of the first capacitor, and the second terminal of the first inductor and the first terminal of the first capacitor are used as a first output terminal of the filter circuit;

a second terminal of the second inductor is connected to a first terminal of the second capacitor, and the second terminal of the second inductor and the first terminal of the second capacitor are used as a second output terminal of the filter circuit;

a second terminal of the third inductor is connected to a first terminal of the third capacitor, and the second terminal of the second inductor and the first terminal of the third capacitor are used as a third output terminal of the filter circuit; and a second terminal of the first capacitor, a second terminal of the second capacitor, and a second terminal of the third capacitor are connected.

11. The method according to claim 10, wherein the second terminal of the first capacitor, the second terminal of the second capacitor, and the second terminal of the third capacitor are further connected to the positive input terminal of the inverter circuit.

12. The method according to claim 10, wherein the second terminal of the first capacitor, the second terminal of the second capacitor, and the second terminal of the third capacitor are further connected to the negative electrode of the first direct current voltage source.

13. The method according to claim 8, wherein the first direct current voltage source and the second direct current voltage source are capacitors.

* * * * *